United States Patent [19]

Sano

[11] Patent Number: 5,567,928
[45] Date of Patent: Oct. 22, 1996

[54] SCANNING EXPOSURE APPARATUS AND METHOD INCLUDING CONTROLLING IRRADIATION TIMING OF AN IRRADIATION BEAM WITH RESPECT TO RELATIVE MOVEMENT BETWEEN THE BEAM AND A SUBSTRATE

[75] Inventor: Naoto Sano, Utsunomiya, Japan

[73] Assignee: Canon Kabushiki Kaisha, Tokyo, Japan

[21] Appl. No.: 280,823

[22] Filed: Jul. 26, 1994

[30] Foreign Application Priority Data

Jul. 26, 1993 [JP] Japan ................................. 5-183963

[51] Int. Cl.$^6$ ........................................................ G01J 1/32
[52] U.S. Cl. ............................ 250/205; 250/216; 355/69
[58] Field of Search ........................ 250/205, 234, 250/235, 236, 216, 548; 356/218; 355/68, 69, 53, 55, 35; 219/121.6, 121.61

[56] References Cited

U.S. PATENT DOCUMENTS

| | | | |
|---|---|---|---|
| 4,819,033 | 4/1989 | Yoshitake et al. | 355/69 |
| 4,884,101 | 11/1989 | Tanimoto | 355/68 |
| 4,905,041 | 2/1990 | Aketagawa | 355/68 |
| 4,970,546 | 11/1990 | Suzuki et al. | 355/53 |
| 5,053,614 | 10/1991 | Yui et al. | 250/205 |
| 5,107,275 | 4/1992 | Tsuruoka et al. | 346/1.1 |
| 5,119,390 | 6/1992 | Ohmori | 372/25 |
| 5,121,160 | 6/1992 | Sano et al. | 355/53 |
| 5,250,797 | 10/1993 | Sano et al. | 250/205 |

FOREIGN PATENT DOCUMENTS 2-177314  7/1990  Japan.

*Primary Examiner*—Que T. Le
*Attorney, Agent, or Firm*—Fitzpatrick, Cella, Harper & Scinto

[57] ABSTRACT

A scanning type exposure apparatus includes an irradiation source for irradiating an irradiation beam, which has an intensity fluctuation upon a start of irradiation; a scanner for imparting relative movement between the irradiation beam and a mask and a substrate to be exposed to a pattern of the mask, wherein the relative movement starts before a start of illumination of the mask with the irradiation beam; and a controller for controlling the irradiation source to start emission of the irradiation beam before a start of the relative movement and a start of the illumination to reduce intensity fluctuation of the irradiation beam.

44 Claims, 4 Drawing Sheets

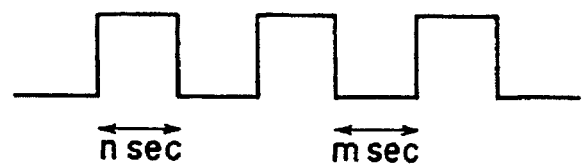
F I G. 1
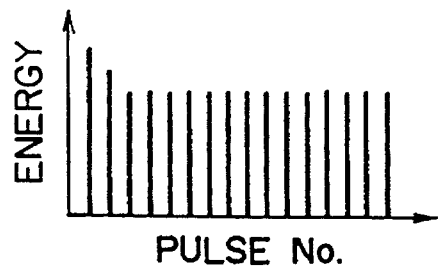
F I G. 2
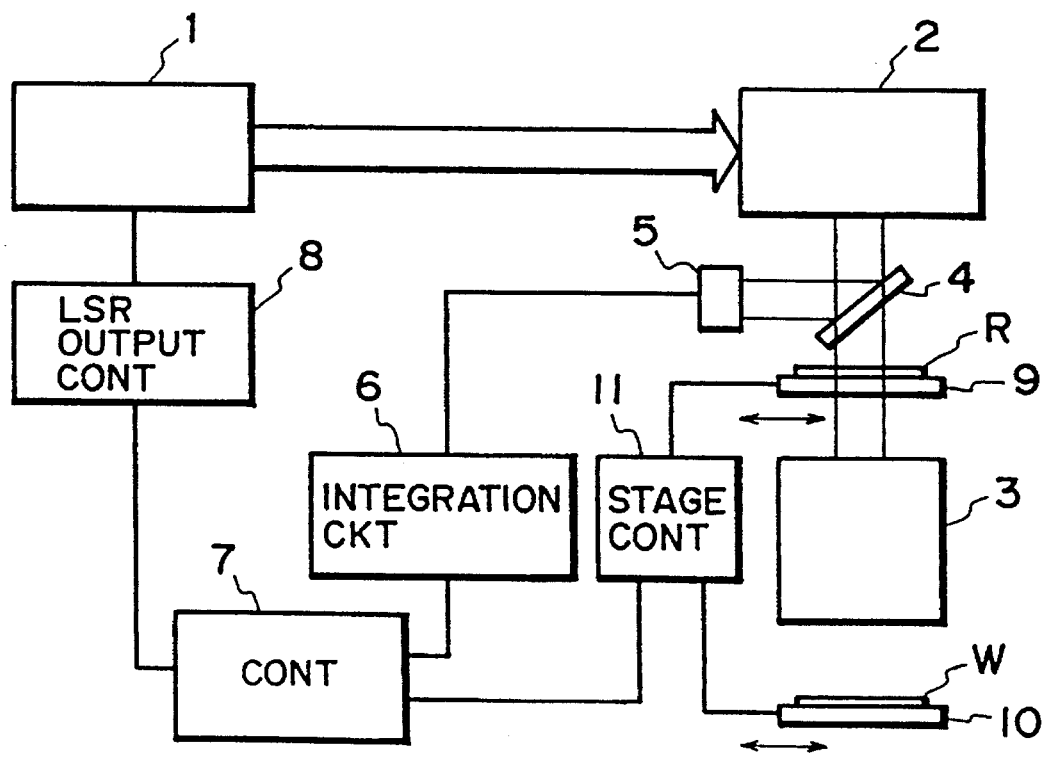
F I G. 3

SCANNING EXPOSURE APPARATUS AND METHOD INCLUDING CONTROLLING IRRADIATION TIMING OF AN IRRADIATION BEAM WITH RESPECT TO RELATIVE MOVEMENT BETWEEN THE BEAM AND A SUBSTRATE

FIELD OF THE INVENTION AND RELATED ART

The present invention relates to a scanning type exposure apparatus and a device manufacturing method, more particularly to a scanning exposure apparatus and a device manufacturing method usable with manufacturing various devices such as IC, LSI, CCD, liquid crystal panels, magnetic heads or the like.

A scanning type exposure apparatus is known in which a mask and a wafer are moved relative to light emitted from an extra-high pressure mercury lamp to scan the pattern areas of the mask and wafer, while projecting a pattern of the mask onto the pattern area of the wafer.

In order to improve the resolution of the scanning type exposure apparatus, use of a pulse laser emitting extreme ultraviolet radiation is considered. A typical one of such pulse lasers is an excimer laser.

However, when the excimer laser replaces the extra-high pressure mercury lamp, the following problems arise.

(1) When the scanning exposure is effected using an excimer laser, the oscillation of the laser is in a burst mode as shown in FIG. 1, in which the laser is oscillated for n sec and is shut off for m sec. However, when the excimer laser is actuated in the burst mode, as shown in FIG. 2, the emitted energy is large for the first several pulses at the start of the burst even if the discharging voltage is constant. This is because the excimer laser is a gas laser, and the state of the gas (laser medium) in the discharging portion is different between the start of oscillation and a stabilized state reached after several pulse oscillations.

In the case of the scanning exposure apparatus, when the emitted energy of the excimer laser changes during a wafer exposure operation, exposure non-uniformity occurs.

(2) In the case of the excimer laser, the emitted energy varies even when the same discharging voltage is applied due to a change of the gas (laser medium) with time, deterioration or contamination of the optical elements used in the laser apparatus. Therefore, even if control parameters for the discharge voltage or the like are set prior to the start of the burst, it is not possible that a predetermined emitted energy is always provided, with the result that the predetermined proper exposure amount cannot be maintained. When the wafer is not scanned with the pulsewise light, it would be possible to change the control parameters during the exposure operation to accomplish the predetermined exposure amount. However, in the scanning type apparatus, the change of the control parameters during the exposure will result in non-uniformity of the exposure.

SUMMARY OF THE INVENTION

Accordingly, it is a principal object of the present invention to provide a scanning type exposure apparatus and a device manufacturing method in which the non-uniformity of the exposure is reduced.

According to an aspect of the present invention, there is provided a scanning type exposure apparatus including an irradiation source for irradiation of a beam, means for scanningly moving a substrate relative to the beam, and control means for controlling the irradiation source during approaching motion of the scanning means.

According to another aspect of the present invention, there is provided a scanning type exposure apparatus comprising: an irradiation source for irradiating an irradiating beam; means for imparting relative movement between the irradiation beam and a mask and a substrate to be exposed to a pattern of the mask, wherein the relative movement starts before a start of illumination of the mask with the irradiation beam; and control means for controlling the irradiation source to start emission of the irradiation beam before a start of the relative movement and a start of the illumination to reduce the intensity of the illumination.

In a preferable aspect of the present invention, a pulsewise laser such as an excimer laser is used as the irradiation source.

In a preferable aspect of the present invention, the control means sets the intensity of the irradiation beam to a predetermined level in response to the proper exposure amount and the scanning speed for the substrate during the approaching period or within a period from a start of the scanning and a start of the illumination.

In a preferable aspect of the present invention, the control means sets the scanning speeds of the mask and the substrate to predetermined levels in response to the intensity of the irradiation beam and the proper exposure amount for the substrate during the approaching period or a period from a start of the scanning operation to the start of the illumination.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 illustrates emittance of an excimer laser.

FIG. 2 illustrates a variation of the energy emitted from the excimer laser.

FIG. 3 is a block diagram of an apparatus according to an embodiment of the present invention.

DESCRIPTION OF THE PREFERRED EMBODIMENTS

Referring to FIG. 3, there is shown a schematic view of an apparatus according to an embodiment of the present invention, which is a scanning type exposure apparatus usable for manufacturing various devices such as IC, LSI, CCD, liquid crystal panels, magnetic heads or the like.

Figure 4:
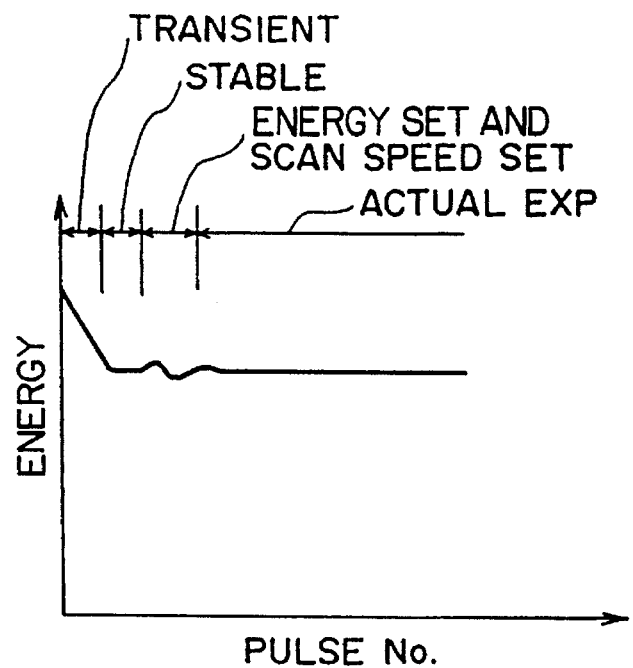
FIG. 4 is a graph showing transient characteristics of the pulse energy.

As shown in FIG. 3, a pulse laser 1 is in the form of an excimer laser using KrF. It produces a pulsewise laser beam (pulse beam). The beam produced by the light source has a central wavelength of 248 nm which is in the extreme ultraviolet radiation range. An illumination optical system 2 comprises an unshown beam reforming optical system, an optical integrator, a collimator lens and a mirror or the like. These elements are made of materials effectively transmitting or reflecting the extreme ultraviolet pulse beam produced by the laser 1. The beam reforming optical system functions to reform the cross-sectional configuration of the incident beam (including the dimensions thereof) into a desired configuration. The optical integrator functions to provide a uniform light intensity distribution to permit uniform illumination for the reticle. A reticle stage 9 is movable and supports a reticle (mask) R having an integrated circuit pattern (device pattern), across an optical path of the pulse beam from the illumination optical system 2. A projection optical system 3 functions to form an image of the device pattern of the reticle R on a wafer W placed on the wafer stage 10. A stage controller 11 functions to move the reticle stage 9 and the wafer stage 10 in synchronism with each other at the respective predetermined speeds. Across the optical path for the pulse beam from the illumination optical system 2, there is provided a half mirror 4 which partly reflects the pulse beam toward a photosensor 5 sensitive to the ultraviolet beam. The output representing the intensity (energy) of the pulse beam detected by the photosensor 5 converted to an exposure amount per 1 pulse of the pulse beam by an integrating circuit 6, and the exposure amount of the wafer W is supplied to the controller 7. A laser output controller 8 controls a laser 1 on the basis of the result of calculations made by the controller 7, and controls the energy for each pulse as desired so that the device pattern of the reticle R is projected on the wafer W with the thus controlled pulse beam. When the excimer laser is actuated in the burst mode, the output thereof is high for the first several pulses, as shown in FIG. 2, In consideration of this fact, the output from the photosensor is monitored immediately after the start of the laser 1, and in the transient period before the stabilization of the pulse light energy, the wafer W is not exposed to the device pattern. In addition, the excimer laser does not necessarily produce pulse beams of the same energy level even if the same control parameter or parameters (discharging voltage or the like) are constant, because of the state of the gas in the excimer laser chamber or the state (contamination or the like) of the optical elements in the laser apparatus. In consideration of this fact, the energy for each pulse is detected by the photosensor 5 after the energy stabilized period is reached, as shown in FIG. 4, after the start of the laser oscillation and the output transient period. On the basis of the output of the photosensor 5, the energy of the pulse beam is controlled to a predetermined level using the laser beam output controller 8. More particularly, the discharge voltage which is an energy setting parameter for the pulse light of the laser 1, is increased or decreased on the basis of the energy level of the pulse light detected by the photosensor 5, thus controlling the energy level of the pulse light. At this time, the feed-back operation can be carried out for each pulse, or the feed back operation may be carried out on the basis of an average of several pulses. After the pulse light from the laser 1 is set to a predetermined level, the speeds of the reticle stage 9 and the wafer stage 10 are checked. In this manner, the device pattern image of the reticle R is continuously projected onto the wafer W.

Figure 5:
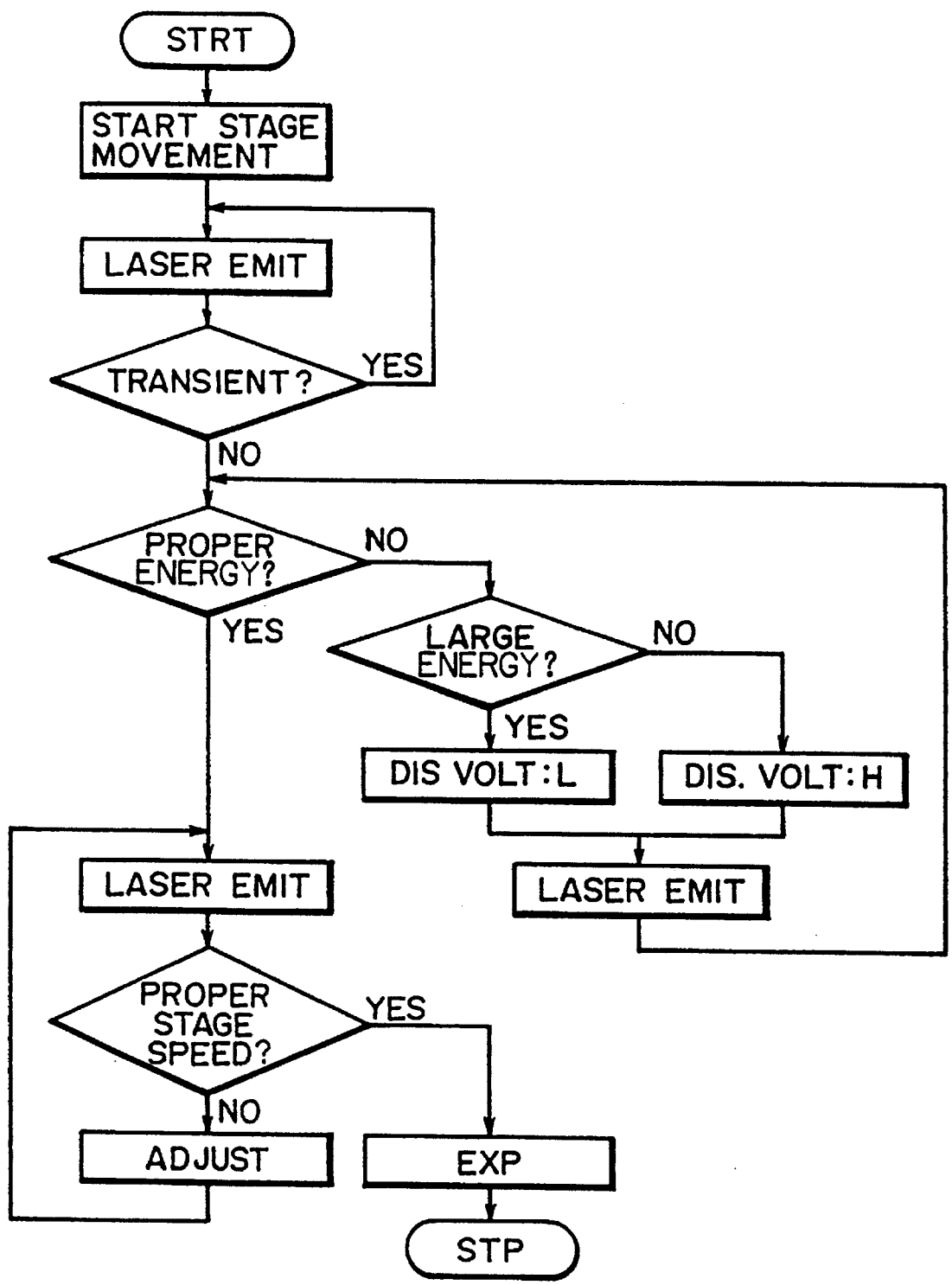
FIG. 5 is a flow chart of a sequential exposure operation in the exposure apparatus of FIG. 3.

In the apparatus of this embodiment, approx. 0.1 sec is required for the stage at rest to reach the proper speed for the exposure. Then, there is provided a delay between the start of the stage drive and the start of the device pattern exposure. If the frequency of the excimer laser is 500 Hz, 50 pulses can be oscillated between the delayed period, that is, the period from the start of the drive for the reticle stage 9 and the wafer stage 10 to the start of the device pattern exposure. In this embodiment, during this 50 pulse period, the laser output is stabilized, and the energy level of the pulse light is controlled, and in addition, the speeds of the stages 9 and 10 are confirmed. For the purpose of stabilizing the output of the laser 1, the pulse beams are produced desirably at a frequency as constant as possible. Therefore, the laser 1 is oscillated substantially at a constant frequency from the start of the laser emission to the end of the exposure operation. FIG. 5 shows the behavior in the scanning exposure control using the apparatus of FIG. 3. The pulse light emission of the laser 1 is started with a start of the motions of the reticle stage 9 and the wafer stage 10 for one shot exposure of the wafer W. On the basis of the change of the pulse light energy, the discrimination is made as to whether the laser 1 reaches an energy stabilized state. If the entrance to the stabilized period is discriminated through the photosensor and the circuit 6, the comparison is made between the set level and an average of the pulse light energy in the stabilized period, using the controller 7. If the controller 7 discriminates that the average is larger, it controls the apparatus 8 to reduce the discharge voltage which is an energy controlling parameter. If the average is smaller, it controls for increasing the discharge voltage. By doing so, the energy level of the pulse beam is set to be a predetermined level. Then, the proper exposure level of the wafer W is confirmed on the basis of the output of the photosensor 5. Continuously, the laser emittance is continued, and it is detected that the speeds of the stages 9 and 10 reach the respective predetermined levels. Subsequently, the device pattern of the reticle is illuminated to start the device pattern exposure of the wafer W. After all of the shot areas of the wafer W are exposed to the device pattern of the reticle R, the operation is completed.

Figure 6:
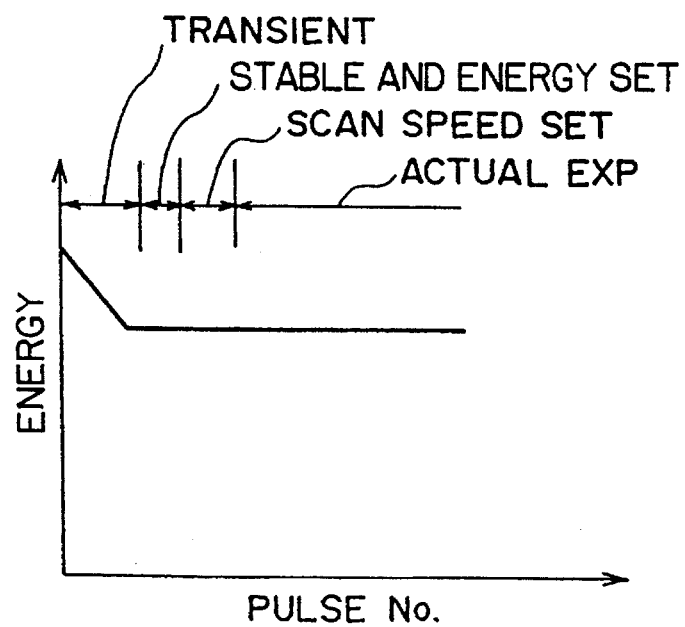
FIG. 6 is a graph showing the transient characteristics of the pulse energy in an apparatus according to another embodiment of the present invention.

In this embodiment, after the pulse light energy is stabilized, the pulse light energy is adjusted, and then the device pattern exposure is carried out. Alternatively, as shown in FIG. 6, the pulse light energy is set after the pulse light energy level is stabilized, and the scanning speeds of the reticle stage 9 and the wafer stage 10 may be adjusted to provide the proper exposure amount on the wafer W, and thereafter, the device pattern exposure may be carried out. According to the scanning type exposure apparatus described above, production of the exposure non-uniformity due to a transient energy level of the pulse laser such as an excimer laser can be avoided, and in addition, the proper exposure operation is possible without influence attributable to variation due to state change of the laser medium (gas) or contamination of the optical elements of the laser. In addition, since substantially all of the operations for the proper setting of the laser output are carried out during the approaching period (stage acceleration period) of the reticle stage and the wafer stage, and therefore, the throughput which is important in the exposure apparatus is not deteriorated.

Figure 7:
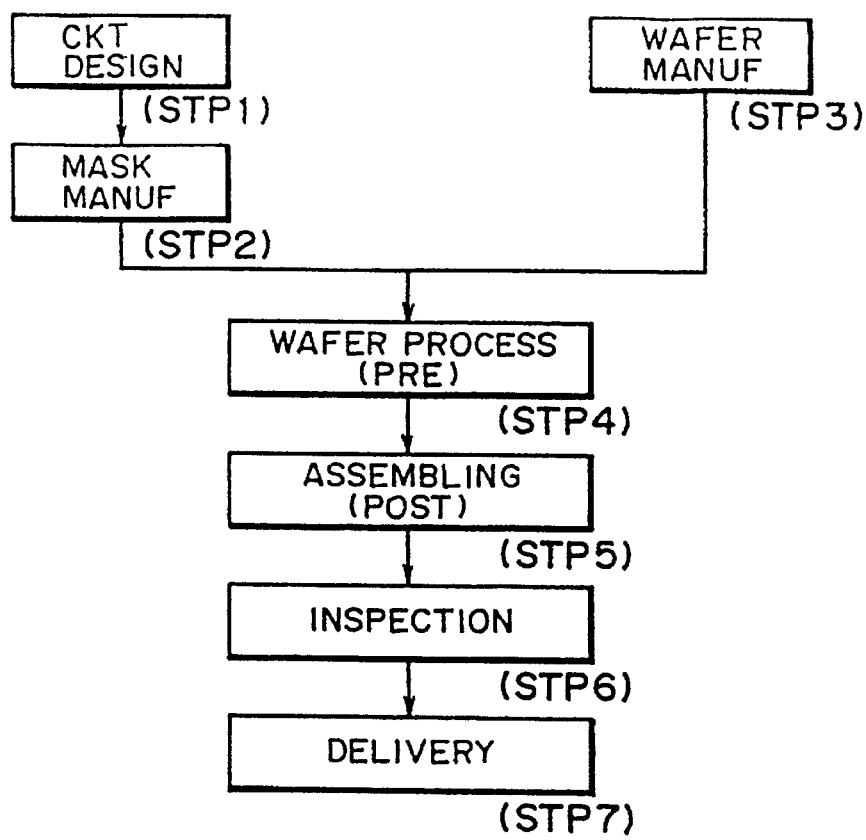
FIG. 7 is a flow chart of a semiconductor manufacturing process.

The description will be made as to an embodiment of a device manufacturing method using the scanning exposure apparatus. FIG. 7 is a flow chart of manufacturing semiconductor devices such as IC, LSI or the like, or devices such as liquid crystal panels or CCD or the like. At step 1, (circuit design), the circuits of the semiconductor device are designed. At step (mask manufacturing) 2, the mask (reticle 304) having the designed circuit pattern is manufactured. On the other hand, at step 3, a wafer (306) is manufactured using the proper material such as silicon. Step 4 (wafer processing) is called a prestep, in which an actual circuit pattern is formed on a wafer through a lithographic technique using the prepared mask and wafer. At step 5 (post-step), a semiconductor chip is manufactured from the wafer subjected to the operations of step 4. The step 5 includes assembling steps (dicing, bonding), a packaging step (chip sealing) or the like. At step 6 (inspection), the operation of the semiconductor device manufactured by the step 5 is inspected, and a durability test thereof is carried out. In this manner, the semiconductor device is manufactured and delivered at step 7.

Figure 8:
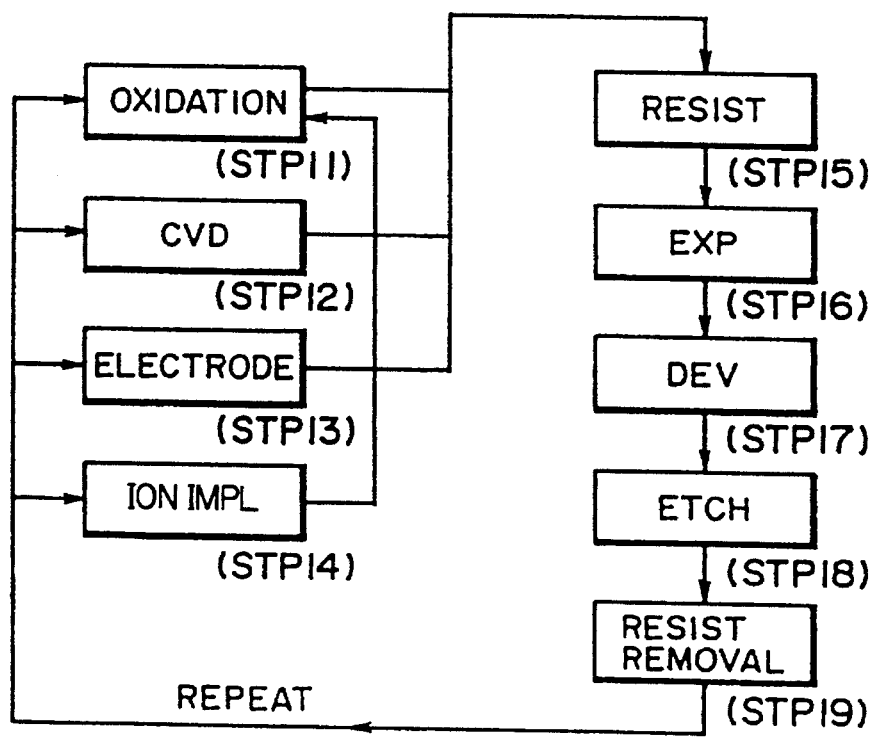
FIG. 8 is a flow chart of a wafer processing operation.

FIG. 8 is a flow chart of detailed wafer processing. At step 11 (oxidation), the surface of the wafer is oxidized. At step 12 (CVD), an insulating film is formed on a surface of the wafer. At step 13 (electrode formation), an electrode is formed on the wafer by evaporation. At step 14 (ion injection), the ion is implanted into the wafer. At step 15 (resist processing), a photosensitive material is applied on the wafer. At step 16 (exposure), the circuit pattern of the mask (reticle 304) is projected onto the wafer by the above-described exposure apparatus. At step 17 (development), the exposed wafer is developed. At step 18 (etching), the portion outside the resist image is removed. At step 19 (resist removal), the resist is removed after the etching. By repeating the above-described steps, overlaid circuit patterns are formed on the wafer.

According to the manufacturing method of the invention, a highly integrated circuit pattern can be formed in the semiconductor devices or the like.

While the invention has been described with reference to the structures disclosed herein, it is not confined to the details set forth and this application is intended to cover such modifications or changes as may come within the purposes of the improvements or the scope of the following claims.

What is claimed is:

1. A scanning type exposure apparatus comprising:
   an irradiation source for irradiating an irradiating beam, which has an intensity fluctuation upon a start of irradiation, to illuminate a mask with the irradiation beam;
   relative movement means for imparting relative movement between the irradiation beam and both a mask and a substrate to be exposed to a pattern of the mask, wherein said relative movement means causes the relative movement to start before a start of illumination of the mask with the irradiation beam; and
   control means for controlling said irradiation source to start irradiation of the irradiation beam after a start of the relative movement and before a start of the illumination of the mask to reduce intensity fluctuation of the irradiation beam.

2. An apparatus according to claim 1, wherein said irradiation source comprises a pulse laser.

3. An apparatus according to claim 2, wherein said irradiation source comprises an excimer laser.

4. An apparatus according to claim 1, wherein said control means sets an intensity of the irradiation beam to a predetermined level after the start of the relative movement and before the start of the illumination of the mask.

5. An apparatus according to claim 4, wherein said irradiation source comprises a pulse laser.

6. An apparatus according to claim 5, wherein said irradiation source comprises an excimer laser.

7. An apparatus according to claim 4, wherein said control means sets the relative motion to a predetermined speed after the start of the relative movement and before the start of the illumination of the mask.

8. An apparatus according to claim 7, wherein said irradiation source comprises a pulse laser.

9. An apparatus according to claim 8, wherein said irradiation source comprises an excimer laser.

10. An apparatus according to claim 1, wherein said control means sets the relative movement to a predetermined speed after the start of the relative movement and before the start of the illumination of the mask.

11. An apparatus according to claim 10, wherein said control means sets the intensity of the irradiation beam after the start of the relative movement and before the start of the illumination of the mask.

12. An apparatus according to claim 11, wherein said irradiation source comprises a pulse laser.

13. An apparatus according to claim 12, wherein said irradiation source comprises an excimer laser.

14. A scanning type exposure apparatus comprising:
    an irradiation source for irradiating an irradiation beam, which has an intensity fluctuation upon a start of irradiation, to illuminate a substrate with the irradiation beam;
    relative movement means for imparting relative movement between the irradiation beam and a substrate, said relative movement means imparting an approaching movement between the irradiation beam and the substrate at a start of the relative movement, during an approaching period; and
    control means for controlling said irradiation source in the approaching period.

15. An apparatus according to claim 14, wherein said irradiating source comprises a pulse laser.

16. An apparatus according to claim 15, wherein said irradiation source comprises an excimer laser.

17. An apparatus according to claim 14, wherein said control means sets the relative movement to predetermined speeds during the approaching period.

18. An apparatus according to claim 14, wherein said control means sets an intensity of the irradiation beam to a predetermined level during the approaching period.

19. A device manufacturing method, comprising:
    irradiating an irradiation beam, which has an intensity fluctuation upon a start of irradiation, to illuminate a mask with the irradiation beam;
    imparting relative movement between the irradiation beam and both a mask and a substrate to be exposed to a pattern of the mask, wherein the relative movement starts before a start of illumination of the mask with the irradiation beam; and
    controlling the irradiation to start irradiation of the irradiation beam after a start of the relative movement and before a start of the illumination of the mask, to reduce intensity fluctuation of the irradiation beam.

20. A method according to claim 19, further comprising setting the relative movement to a predetermined speed after a start of the relative movement and before a start of the illumination of the mask.

21. A method according to claim 20, further comprising setting the intensity of the irradiation beam to a predetermined level after a start of the relative movement and before a start of the illumination of the mask.

22. A method according to claim 21, wherein the irradiation beam is emitted from a pulse laser.

23. A method according to claim 22, wherein the irradiation beam is emitted from an excimer laser.

24. A device manufacturing method comprising:

irradiating an irradiation beam, which has an intensity fluctuation upon a start of irradiation, to illuminate a substrate with the irradiation beam;

imparting relative movement between the irradiation beam and a substrate, the relative movement including an approaching movement between the irradiation beam and the substrate at a start of the relative movement, during an approaching period; and controlling the irradiation of the irradiation beam in the approaching period.

25. A method according to claim 24, further comprising setting the relative movement to a predetermined speed during the approaching period.

26. A method according to claim 24, further comprising setting the intensity of the irradiation beam to a predetermined level during the approaching period.

27. A method according to claim 24, wherein the irradiation beam is emitted from a pulse laser.

28. A method according to claim 27, wherein the irradiation beam is emitted from an excimer laser.

29. A scanning type exposure apparatus comprising:

an irradiation source for irradiating an irradiation beam, which has an intensity fluctuation upon a start of irradiation;

scanning means for scanning a substrate with the irradiation beam to illuminate the substrate with the irradiation beam, wherein a start of the scanning performed by said scanning means is earlier than illumination of the substrate with the irradiation beam; and control means for controlling said irradiation source to start irradiation of the irradiation beam after a start of the scanning and before a start of the illumination to reduce the intensity fluctuation of the irradiation beam in advance.

30. An apparatus according to claim 29, wherein said irradiation source comprises a pulse laser.

31. An apparatus according to claim 30, wherein said irradiation source comprises an excimer laser.

32. An apparatus according to claim 29, wherein said control means sets an intensity of the irradiation beam to a predetermined level after the start of the scanning and before the start of the illumination.

33. An apparatus according to claim 32, wherein said irradiation source comprises a pulse laser.

34. An apparatus according to claim 33, wherein said irradiation source comprises an excimer laser.

35. An apparatus according to claim 32, wherein said control means sets a speed of the scanning to a predetermined speed after the start of the scanning and before the start of the illumination.

36. An apparatus according to claim 35, wherein said irradiation source comprises a pulse laser.

37. An apparatus according to claim 36, wherein said irradiation source comprises an excimer laser.

38. An apparatus according to claim 29, wherein said control means sets a speed of the scanning to a predetermined speed after the start of the scanning and before the start of the illumination.

39. An apparatus according to claim 38, wherein said control means sets the intensity of the irradiation beam after the start of the scanning and before the start of the illumination.

40. An apparatus according to claim 39, wherein said irradiation source comprises a pulse laser.

41. An apparatus according to claim 40, wherein said irradiation source comprises an excimer laser.

42. A scanning type exposure apparatus comprising:

an irradiation source for irradiating an irradiation beam, which has an intensity fluctuation upon a start of irradiation;

scanning means for scanning a mask with the irradiation beam and scanning a substrate through the mask with the irradiation beam to illuminate the substrate with the irradiation beam, the irradiation beam having an intensity fluctuation upon a start of irradiation, wherein a start of the scanning performed by said scanning means is earlier than illumination of the substrate with the irradiation beam; and control means for controlling said irradiation source to start irradiation of the irradiation beam after a start of the scanning and before a start of the illumination to reduce the intensity fluctuation of the irradiation beam in advance.

43. A scanning type exposure apparatus comprising:

an irradiation source for irradiating an irradiation beam, which has an intensity fluctuation upon a start of irradiation;

scanning means for scanning a substrate with the irradiation beam, which has an intensity fluctuation upon a start of irradiation, said scanning means imparting an approaching movement between the beam and the substrate in an approaching period; and control means for controlling said irradiation source in the approaching period.

44. A scanning type exposure apparatus comprising:

scanning means for scanning a substrate with an irradiation beam to illuminate the substrate with the irradiation beam, which has an intensity fluctuation upon a start of irradiation, wherein a start of the scanning performed by said scanning means is earlier than illumination of the substrate with the irradiation beam; and control means for controlling said irradiation source to start irradiation of the irradiation beam after a start of the scanning and before a start of the illumination to reduce intensity fluctuation of the irradiation beam in advance.

* * * * *